United States Patent [19]

Desilets et al.

[11] 4,362,596
[45] Dec. 7, 1982

[54] ETCH END POINT DETECTOR USING GAS FLOW CHANGES

[75] Inventors: Brian H. Desilets, Wappingers Falls; Thomas A. Gunther, Hopewell Junction, both of N.Y.

[73] Assignee: International Business Machines Corp., Armonk, N.Y.

[21] Appl. No.: 279,127

[22] Filed: Jun. 30, 1981

[51] Int. Cl.³ .......................................... H01L 21/306
[52] U.S. Cl. .................................... 156/627; 156/643; 156/646; 156/653; 156/657; 156/345; 204/192 E; 204/298; 252/79.1
[58] Field of Search ............... 156/626, 627, 643, 646, 156/345, 653, 657; 204/164, 192 E, 298; 250/531

[56] References Cited

U.S. PATENT DOCUMENTS 4,115,184 9/1978 Poulsen ............................... 156/626

FOREIGN PATENT DOCUMENTS 53-13967 11/1978 Japan .................................. 156/626

*Primary Examiner*—William A. Powell
*Attorney, Agent, or Firm*—John A. Jordan

[57] ABSTRACT

As etching progresses from one layer of material to another in reactive ion etching systems, the partial pressures of the reaction chamber gas components change. In constant pressure reactive ion etching systems, changes in chamber pressure are corrected by changes in the etchant species flow rate into the reaction chamber. By monitoring flow rate, information is obtained which may be used to identify the points where partial pressures change, and latter may, in turn, be used to derive etching points in the material being etched.

11 Claims, 5 Drawing Figures

BATCH OF 20 SiO₂ WAFERS

ETCH END POINT DETECTOR USING GAS FLOW CHANGES

DESCRIPTION

Background of the Invention

1. Field of the Invention

The present invention relates to method and apparatus for etch end point detection and, more particularly, to method and apparatus for etch end point detection in reactive ion etching apparatus.

2. Description of the Problem and Prior Art

One of the difficulties encountered in prior art end point detecting schemes used to detect the etch end point in dry etching systems resides in the ability of the apparatus to accurately detect the end point of the material being etched. The problem of accuracy of detection is compounded when batch etching is involved, particularly where the layers being etched are of the order of microns thick.

Typically, end point detectors "look" at a single wafer to detect etch end point. For example, commonly employed laser etch end point detectors direct the laser signal to a single wafer and compare the reflected signal from the wafer to a reference signal derived from a known reference. In the main, such apparatus base detection on interferometric techniques.

In batch processing, etch end point detectors, such as laser detectors, typically monitor a wafer selected randomly. Since there is more than nominal variation in etching rate and film thickness from wafer to wafer in such batch systems, monitoring a wafer randomly selected may give rise to overetching and/or underetching a number of wafers. Since the etching characteristics vary from batch to batch, it is difficult to select a given wafer to monitor and adjust etching time in accordance with historic patterns.

Prior art batch etch end point detectors typically employ detection of changes in the etching system characteristics as a manifestation of etch end point. One such detector, as employed to detect etch end point in plasma dry etching systems, is that described by Robinson et al in U.S. Pat. No. 4,201,579. Robinson et al describe an etch end point detector wherein hydrogen, as the etching plasma, creates a reaction product which changes the effective impedance matching network and increases reflected power. Reflected power from the reactor is monitored to detect etch end point.

In a manner somewhat analogous to that described by Robinson et al, A. R. Tretola describes in U.S. Pat. No. 4,207,137 a plasma etching end point detector arrangement wherein the impedance of the plasma during etching is monitored to detect end point.

The difficulty with the Robinson et al and Tretola approach resides in their accuracy and their inability to be employed in typical commercial reactive ion etching apparatus. In this regard, commercial reactive ion etching apparatus typically employ automatic impedance matching arrangements to insure matching of the electrode-plasma-electrode system.

SUMMARY OF THE INVENTION

It is, therefore, an object of the present invention to provide an improved etch end point detection method and apparatus.

It is a further object of the present invention to provide an etch end point detection method and apparatus for detecting etch end point in dry etching systems.

It is yet a further object of the present invention to provide an improved etch end point detection arrangement for detecting etch end point in dry etch batch processing systems.

It is yet still a further object of the present invention to provide an improved etch end point detector for batch processing reactive ion etching systems.

It is another object of the present invention to provide an etch end point detector for batch operated, constant pressure reactive ion etching systems wherein end point is detected by changes in etchant species flow rate.

In accordance with the principles of the present invention, accurate etch end point detection is achieved in a batch operated reactive ion etching system. It has been determined that in dry etching chambers, substantial variation in both the number of constituent species and their concentration in the reaction chamber occurs during the transition of etching through the final molecules of one layer of material and the beginning of molecules of another layer of material. Changes in the number of constituent species and their concentration in the reaction chamber also cause changes in the chamber pressure.

In accordance with further principles of the present invention, batch end point detection is determined by monitoring changes in the etchant species flow as the flow is varied to maintain constant pressure in accordance with changes in the reaction chamber species. A reference signal is beat against a signal from the flow meter to provide a sharp output signal change with changes in the flow meter signal.

DESCRIPTION OF THE PREFERRED EMBODIMENTS

The invention will be described with reference to the reactive ion etching system, in accordance with the present invention, as shown schematically in FIG. 1. It should be appreciated that the apparatus shown in FIG. 1 is illustrative only, and the invention may be practiced with any of a variety of reactive ion etching apparatus which employ constant pressure techniques.

Figure 1:
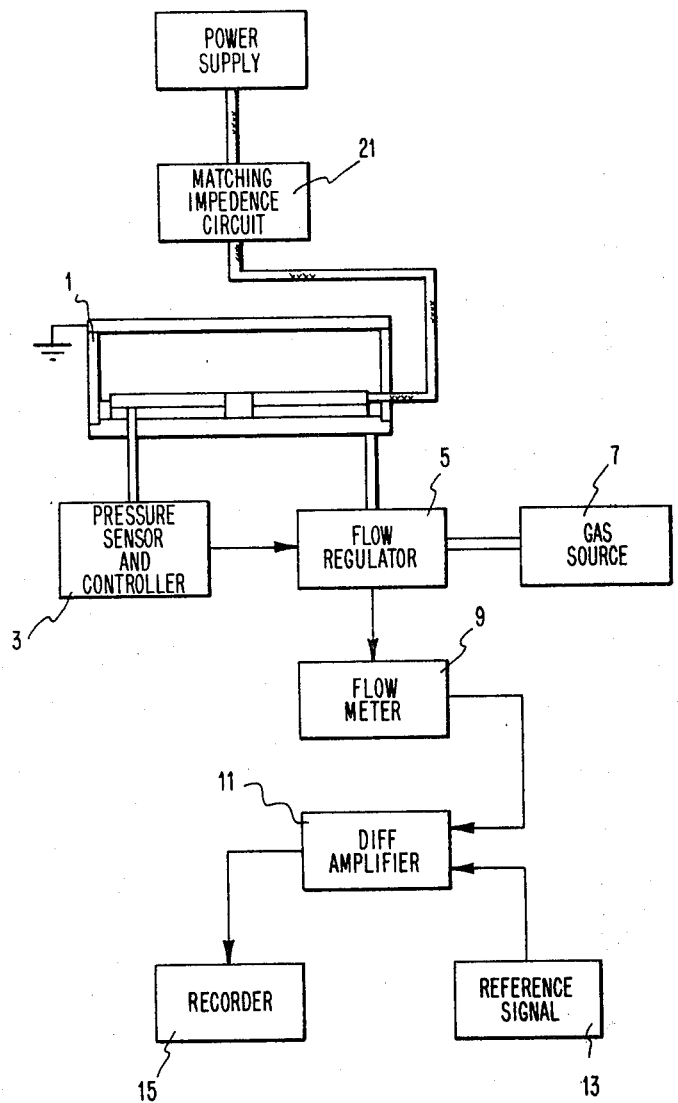
FIG. 1 shows a schematic diagram of a reactive ion etching system with etch end point detector, in accordance with the present invention.

As shown in FIG. 1, reactive ion etching (RIE) chamber 1 comprises a typical RIE chamber, as known to those skilled in the art. In this regard, it should be appreciated that chamber 1 is of sufficient dimension to permit batch etching of wafers, as for example the batch etching of up to 50 wafers. Connected to chamber 1, as shown in FIG. 1, is a conventional pressure sensor and controller 3. Such a sensor/controller may, for example, comprise a commercially available MKS Baratron system. The function of sensor/controller 3, as is known to those skilled in the art, is to sense the pressure within chamber 1 and provide a feedback signal in accordance with the sensed pressure to flow regulator 5. Flow regulator 5 regulates the flow of etchant gas from source 7 to chamber 1 in accordance with the feedback signal from sensor/controller 3.

Systems akin to that thus far described with respect to FIG. 1 are well known to those skilled in the art. One such arrangement is that employed by Plasma-Therm, Inc., in the Dual Reactive Ion and Plasma Etch System, Model PK-2440 PE/RIE.

As further shown in FIG. 1, flow meter 9, coupled to flow regulator 5 acts to provide a visual indication of the flow rate of flow regulator 5. Again, flow meter 9 may be any of a variety of conventional flow meters which act to detect flow rate and provide electrical and visual indications of the flow rate. In addition to providing a visual indication of flow rate, flow meter 9 also acts to provide to one input of differential amplifier 11 an analog signal indicative of flow rate. Connected to the other input terminal of differential amplifier 11 is a reference signal from signal source 13. The output of differential amplifier 11 is connected to recorder 15.

As is understood by those skilled in the art, reference signal 13 acts to provide a beat signal to differential amplifier 11 which signal acts to cancel the quiescent analog signal from flow meter 11.

In accordance with the present invention, it has been found that variations in the flow rate, as determined by flow meter 9, may readily be employed as an accurate indicator of the end of etching through a given material. More particularly, it is known in systems, as shown in FIG. 1, operating under constant pressure that pressure is maintained constant by varying flow rate. As etching within the RIE chamber progresses from one material to another, changes occur in the partial pressures of the chamber gas components and, hence, the total pressure of the system wants to change. The tendency of the chamber pressure to want to change in either direction is thus indicative of the etching process passing through the boundary from one type of material to another.

With more particular reference to FIG. 1, then, as etching progresses through the final molecules of one material and commences etching the molecules of another material, the change in the number of chamber particles produced by this transition causes a change in the chamber pressure, which change is sensed by sensor/controller 3. Sensor/controller 3 in turn produces a signal indicative of this change, which signal is fed to flow regulator 5 such as to change the etchant flow rate gas species to the chamber and maintain the chamber pressure constant. It should be appreciated that any of a variety of etchant gases may be employed in the system of the present invention in dependance upon which etchant gas is best suited for the particular structure being etched. For example, source 7 may comprise anyone of $CF_4$, $CHF_3$, $CCL_4$, $CF_4H_2$ or $CF_4O_2$ etchant gases.

In accordance with the present invention, changes in flow rate effected by flow regulator 5 are detected by flow meter 9. As shown, flow meter 9, in turn, provides an analog signal to differential amplifier 11 indicative of the change in flow rate. Differential amplifier 11, in cooperation with a reference signal from 13, acts to provide an output to recorder 15 with marked changes occurring where flow rate changes occur.

Figure 2:
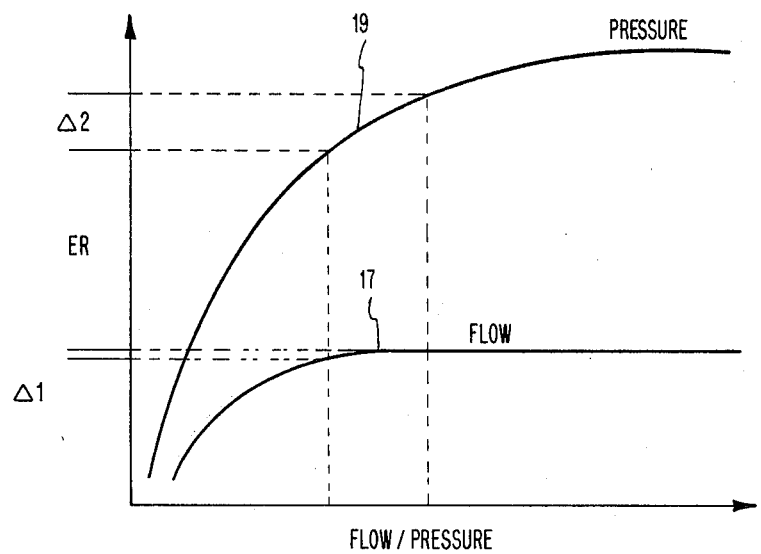
FIG. 2 shows a plot of the etch rate (ER) versus both etchant gas flow rate and etching chamber pressure.

One of the advantages of sensing flow rate as opposed to pressure, for example, may be seen more clearly with reference to FIG. 2. FIG. 2 depicts the manner in which etch rate (ER) varies as a function of flow rate on the one hand and pressure on the other. As can be seen, any significant changes in pressure, as manifested by curve 19, acts to cause substantial changes in etch rate. On the other hand, any significant changes in flow rate above the "knee" of curve 17 acts to cause little variation in etch rate. This can be seen by comparing $\Delta 1$ with $\Delta 2$ along the etch rate axis. Thus, by maintaining the chamber pressure constant and varying flow rate, little change occurs in the etch rate.

It should also be appreciated that changes in the constituent species within the etching chamber also act to change the impedance matching of the electrode-plasma-electrode system. Changes in the impedance match act to cause changes in the power delivered to the system and changes in power, in turn, vary the etch rate. Accordingly, to maintain, as near as possible, a constant or uniform etch rate, the system schematically shown in FIG. 1 also includes an automatic impedance matching circuit 21 which acts to adjust, automatically, the impedance match in accordance with changing chamber conditions whereby a constant power is delivered to the system.

Figure 3:
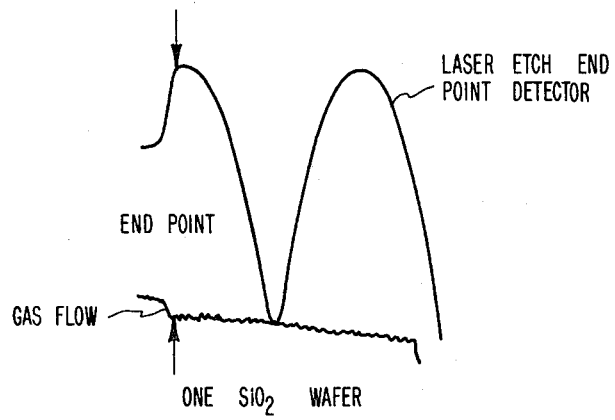
FIG. 3 shows a recorder plot of both a laser etch end point detector characteristic and gas flow rate characteristic exhibited when etching a single $SiO_2$ wafer in a reactive ion etching system.

The manner in which the arrangement shown in FIG. 1 may be employed to determine etch end point may be shown more particularly with reference to the trace of recorder plots shown in FIG. 3, as taken from recorder 15. In this regard, recorder 15 is a dual pen recorder which permits the simultaneous recording of a pair of characteristics. With reference to FIG. 3, the upper characteristic is that of a conventional laser etch end point detector. The arrow shown above this characteristic designates the point in time where etch end point is detected, as manifested by the abrupt drop in signal. The lower curve represents etchant species flow rate as monitored in accordance with the principles of the present invention. The plots of FIG. 3 are the result of monitoring a single $SiO_2$ wafer in a typical etching tool having a capacity of, for example, 30 or so wafers. The arrow below the flow rate curve designates the point in time where etch end point is determined in accordance with the method and apparatus of the present invention. As can be seen, an abrupt change occurs at this latter arrow which change represents a significant change in flow rate. As hereinabove described, the change in flow rate, in turn, represents the response of pressure sensor/controller 3 in FIG. 1 sensing pressure changes in the etching chamber caused by changes in the number of particles present within the chamber.

Figure 4:
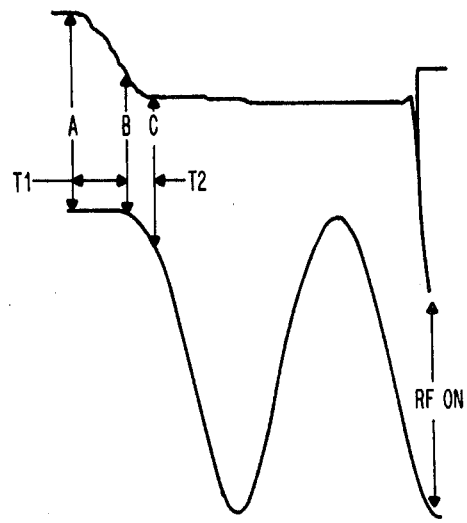
FIG. 4 shows a recorder plot of both a laser etch end point detector characteristic and gas flow rate characteristic exhibited when etching a batch of 20 $SiO_2$ wafers in a reactive ion etching system.

FIG. 4 shows the trace of further dual pen recorder plots for a conventional laser etch end point detector and flow rate detector as taught by the present invention. The plots of FIG. 4 are the result of monitoring a batch of 20 $SiO_2$ wafers with the upper curve representing the flow rate monitoring curve and the lower curve representing the laser etch end point detector characteristic. The arrows at A show the point in time when the first wafer of the batch is penetrated, i.e. the point in time when the $SiO_2$ layer has been etched through to the underlying silicon layer. The arrows at B designate the point in time when etch end point is detected by the laser detector for the total batch. This is characterized by the point on the lower curve where a constant signal commences. The point in time shown by arrow C corresponds to the etch end point completion for the total batch of $SiO_2$ wafers, as determined by the flow rate method of the present invention. As can be seen, completion of etching for the entire batch is characterized in the flow rate curve by the beginning of a constant flow rate after the flow rate change between arrows A and C is completed. The leveling off of the flow rate curve at C indicates that with this constant flow rate, the system has constant pressure and constant pressure indicates that the number of particles within the chamber are relatively constant and, therefore, all wafers have had their $SiO_2$ layer etched through.

As is evident from the above discussion, the distance between arrow A and arrow C represents the time to complete total batch etching after the first wafer begins to penetrate the interface between the $SiO_2$ layer being etched and the underlying Si substrate. As can be seen from the plots, the laser etch end point detector typically detects etch end point somewhere between point A and point C, in accordance with the particular wafer selected for detection. As is evident, the larger the batch being etched and the more non-uniform the etching, the larger the time between A and C and, therefore, the less accurate the laser etch end point detector becomes.

Figure 5:
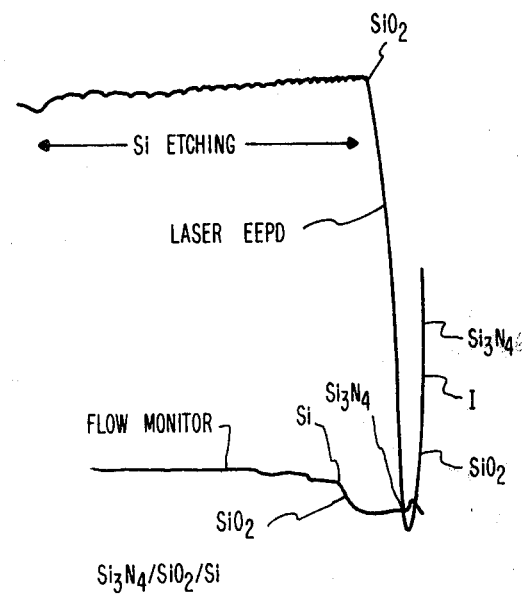
FIG. 5 shows a recorder plot of both a laser etch end point detector characteristic and gas flow rate characteristic exibited when etching a batch of 31 $Si_3N_4/SiO_2/Si$ wafers in a reactive ion etching system.

FIG. 5 shows a typical trace observed in etching, for example, 31 recessed oxide isolation wafers. Inflection point I represents the point in time, in accordance with the etch end point laser detector, where the layer of silicon nitride is etched through to the underlying layer of $SiO_2$. Since this inflection point is small, detection of the etch end point for the silicon nitride layer is difficult and, moreover, because of the steepness of the curve, inaccuracy is large. Again, with reference to the laser etch end point detection curve shown in FIG. 5, it can be seen that the curve levels off as the $SiO_2/Si$ interface is passed through as shown at the arrow designated $SiO_2$. Silicon etching then continues for the ROI, as designated in the plot. By way of comparison, it can be seen that the flow rate characteristic shown at the bottom of FIG. 5 detects the silicon nitrate etch end point at the point shown by the arrow designated $Si_3N_4$. The bottom of the trough of the flow rate curve represents the period of time within which the $SiO_2$ layer is being etched. Silicon etching commences at the arrow designated Si.

As demonstrated by FIG. 5, it can be seen that the flow rate characteristics exhibit marked changes at etch end point. By comparing these marked changes with the changes in the laser etch end point detection characteristic indicative of etch end point, it can be seen that, for batch process etching, detection of etch end point by the flow rate monitoring is much more accurate and reliable than detection by laser etch end point detection.

While the invention has been particularly shown and described with reference to the preferred embodiment thereof, it will be understood by those skilled in the art that various changes in form and detail may be made therein without departing from the spirit and scope of the invention.

We claim:

1. A method of detecting etch end point in reactive ion etching, comprising the steps of,
   monitoring the rate of flow of etchant species into a reactive ion etching reaction chamber wherein said rate of flow of etchant species into said chamber is a function of gas species pressure within said chamber; and
   detecting etch end point by monitoring changes in the rate of flow of etchant species into said chamber with said changes in the rate of flow of etchant species into said chamber being indicative of changes in the partial pressure of constituent species within said chamber caused by changes in the material being etched.

2. The method as set forth in claim 1 wherein said material being etched comprises a plurality of wafers.

3. The method as set forth in claim 2 including the step of maintaining constant power to said chamber.

4. A method of detecting etch end point in a reactive ion etching chamber, comprising the steps of:
   monitoring chamber pressure to sense changes in pressure caused by changes in gas species within said chamber with said changes in gas species being caused by changes in the material being etched in said chamber;
   controlling the rate of etchant species gas flow into said chamber in accordance with sensed changes in pressure so as to maintain a constant pressure within said chamber;
   monitoring the rate of etchant species gas flow into said chamber; and
   detecting etch end point by detecting changes in the rate of flow of etchant species into said chamber with said changes in the rate of flow of etchant species being indicative of changes in the material being etched.

5. The method as set forth in claim 4 wherein said material being etched in said reactive ion etching chamber includes a plurality of wafers.

6. The method as set forth in claim 5 wherein said step of detecting includes recording a signal which manifests changes in the rate of etchant species gas flow into said chamber.

7. The method as set forth in claim 6 including the step of maintaining constant power to said reactive ion etching chamber.

8. In a batch processing reactive ion etching system wherein pressure within the system reaction chamber is sensed to control through flow regulator means the flow of etchant species into said chamber to maintain constant pressure therein, the improvement residing in an arrangement for detecting etch end point, comprising;
   means to sense the rate of flow of etchant species through said flow regulator means into said chamber and provide an electrical signal indicative of said rate of flow; and
   means to detect etch end point including means to monitor said electrical signal indicative of said rate of flow of etchant species into said chamber to detect changes in the rate of flow of etchant species wherein said changes in the rate of flow of etchant species are indicative of changes in the material being etched in said reaction chamber.

9. The system as set forth in claim 8 wherein said means to sense the rate of flow of etchant species through said flow regulator means includes flow meter means.

10. The system as set forth in claim 8 wherein said means to sense the rate of flow of etchant species through said flow regulator means acts to provide an analog signal indicative of said rate of flow.

11. The system as set forth in claim 10 wherein said means to detect etch end point includes differential amplifier means having one differential input coupled to receive said analog signal and the other differential input coupled to receive a reference signal which acts to beat against said analog signal whereby changes in said analog signal are amplified at the differential amplifier means output terminal.

* * * * *